(12) United States Patent
Kim et al.

(10) Patent No.: US 8,643,175 B2
(45) Date of Patent: Feb. 4, 2014

(54) MULTI-CHANNEL PACKAGE AND ELECTRONIC SYSTEM INCLUDING THE SAME

(75) Inventors: Kil-Soo Kim, Hwaseong-si (KR); Sun-Pil Youn, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/541,962

(22) Filed: Jul. 5, 2012

(65) Prior Publication Data
US 2013/0021760 A1 Jan. 24, 2013

(30) Foreign Application Priority Data
Jul. 21, 2011 (KR) .................. 11-2011-0072570

(51) Int. Cl.
*H01L 23/64* (2006.01)
*H01L 23/528* (2006.01)

(52) U.S. Cl.
USPC ............. 257/723; 257/786; 257/E23.175; 361/735; 361/736

(58) Field of Classification Search
None
See application file for complete search history.

(56) References Cited

U.S. PATENT DOCUMENTS

| | | | |
|---|---|---|---|
| 6,252,305 B1 | 6/2001 | Lin et al. | |
| 7,411,292 B2* | 8/2008 | Chen et al. | 257/724 |
| 7,781,878 B2* | 8/2010 | Chen et al. | 257/686 |
| 2005/0029645 A1* | 2/2005 | Mess et al. | 257/686 |
| 2009/0218670 A1* | 9/2009 | Yamamoto et al. | 257/686 |
| 2012/0056335 A1* | 3/2012 | Gillingham | 257/777 |

FOREIGN PATENT DOCUMENTS

| | | |
|---|---|---|
| JP | 2002-231882 | 8/2002 |
| JP | 2005-150459 | 6/2005 |

OTHER PUBLICATIONS

Nitin Agrawal, Vijayan Prabhakaran, Ted Wobber, John D. Davis, Mark Manasse, and Rina Panigrahy, "Design tradeoffs for SSD performance" In USENIX Annual Technical Conference, pp. 57-70, Boston, MA, Jun. 2008.*
Micheloni, Rino and Kam Eshghi. SSD Architecture and PCI Express Interfce. Dordrecht: Springer, 2013.*
Enterprise SSDs with Unmatched Performance, Kam Eshghi, Flash Storage Summits 2010.*
Lee, S.W. et. al. "A Case for Flash Memory SSD in Enterprise Database Applications", SIGMOD'08, Jun. 9-12, 2008, Vancouver, BC, Canada.*
Native PCIe SSD Controllers' by Marvell downloaded from URL < http://www.marvell.com/storage/system-solutions/native-pcie-ssd-controller/assets/Marvell-Native-PCIe-SSD-Controllers-WP.pdf> on Jun. 13, 2013.*
SSD Storage Application Presentation NXP 3Q 2012.*

* cited by examiner

*Primary Examiner* — Thomas L Dickey
*Assistant Examiner* — Joseph Schoenholtz
(74) *Attorney, Agent, or Firm* — Volentine & Whitt, PLLC

(57) ABSTRACT

A multi-channel package has at least four channels and includes a package substrate having a first surface and a second surface, semiconductor chips mounted on the first surface of the package substrate, and external connection terminals disposed on the second surface of the package substrate and electrically connected to the semiconductor chips by the at least four channels. Each channel is dedicated to one or a group of the chips. An electronic system includes a main board, at least one such multi-channel package mounted on the main board, and a controller package that is mounted on the main board, has 4n channels (wherein n≥2) and controls the at least one multi-channel package.

19 Claims, 16 Drawing Sheets

MULTI-CHANNEL PACKAGE AND ELECTRONIC SYSTEM INCLUDING THE SAME

PRIORITY STATEMENT

This application claims the benefit of Korean Patent Application No. 10-2011-0072570, filed on Jul. 21, 2011, in the Korean Intellectual Property Office, the disclosure of which is hereby incorporated by reference in its entirety.

BACKGROUND

The inventive concept relates to semiconductor packages. More particularly, the inventive concept relates to multi-channel packages and to electronic device including a multi-channel package.

Although semiconductor devices are being scaled down to meet such demands as the demand for smaller and smaller electronic products, the semiconductor devices must still be able to process very large amounts of data. Accordingly, i.e., to meet such demands, semiconductor chips of today's electronic products need to be highly integrated and incorporated into a single package. Moreover, in addition to the need for highly integrated semiconductor chips, there is a demand for chips that offer better performance and greater reliability. Similarly, there is an ever increasing demand for electronic systems that operate at higher speeds.

SUMMARY

According to an aspect of the inventive concept, there is provided a multi-channel package having at least four channels and comprising a package substrate having a first surface and a second surface, 4n semiconductor chips mounted to the package substrate on the first surface thereof, wherein n is a positive integer, and a plurality of external connection terminals on the second surface of the package substrate. Each of the channels constitutes a discrete path in the package associated with and along which signals are transmitted to/from a respective one or group of the semiconductor chips in the package. Also, each of the channels is discrete and independent from the other channels in the package such that each of the chips can transmit/receive signals to/from the external connection terminals via only one of the channels amongst the at least four channels.

According to an aspect of the inventive concept, there is provided an electronic system comprising a main board including wiring, at least one multi-channel package having at least four channels and mounted to the main board, and a controller package mounted on the main board. The controller package has 4n channels wherein n is an integer equal to or greater than 2. Each multi-channel package comprises at least four semiconductor chips, and external connection terminals by which the package is electrically connected to the main board. Also, each of the channels of the multi-channel package constitutes a discrete path in the package associated with and along which signals are transmitted to/from a respective one or a group of the semiconductor chips in the package, and each of the channels is discrete and independent from the other channels in the package. Therefore, each of the chips can transmit/receive signals to/from the external connection terminals via only one of the channels. Respective ones of the channels of the controller package are connected by the wiring of the main board to respective ones of the channels of the at least one multi-channel package.

According to another aspect of the inventive concept there is provided an electronic device comprising a main board including a wiring pattern of discrete wires, at least one multi-channel package having at least four channels mounted to the main board, and a controller package mounted on the main board. Each multi-channel package includes a package substrate having a first surface and a second surface, 4n semiconductor chips mounted to the package substrate on the first surface thereof, wherein n is a positive integer, and a plurality of external connection terminals on the second surface of the package substrate and by which the multi-channel package is electrically connected to the wiring of the main board. The controller package has a number of channels equal to the total number of channels of the multi-channel package or packages mounted to the main board, and the channels of the controller package are connected to the channels of the at least one multi-channel package, respectively, by the wires of the wiring pattern of the main board, respectively.

BRIEF DESCRIPTION OF THE DRAWINGS

The inventive concept will be more clearly understood from the following detailed description of preferred embodiments thereof made in conjunction with the accompanying drawings in which.

DETAILED DESCRIPTION OF THE PREFERRED EMBODIMENTS

Figure 1:
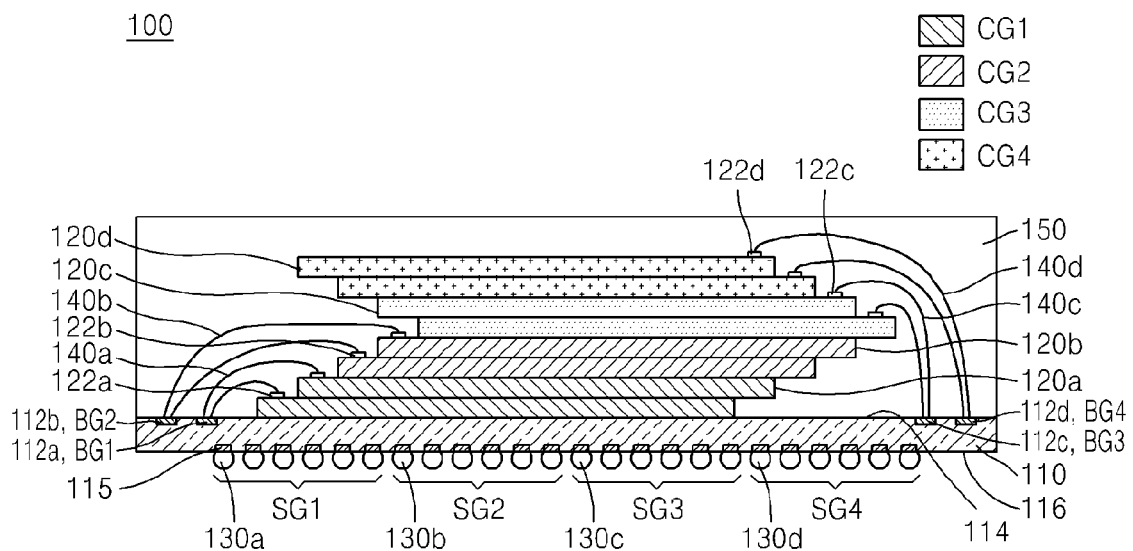
FIG. 1 is a cross-sectional view of an embodiment of a multi-channel package according to the inventive concept.

Various embodiments and examples of embodiments of the inventive concept will be described more fully hereinafter with reference to the accompanying drawings. In the drawings, the sizes and relative sizes and shapes of elements and layers shown in section may be exaggerated for clarity. In particular, the cross-sectional illustrations of the semiconductor packages are schematic. Also, like numerals are used to designate like elements throughout the drawings.

Furthermore, the terminology used herein for the purpose of describing particular examples or embodiments of the inventive concept is to be taken in context. For example, the term "connected" generally will refer to an electrical connection in the context of this are. Furthermore, the terms "comprises" or "comprising" when used in this specification specifies the presence of stated features but does not preclude the presence or additional features.

It will also be understood that when a component is referred to as being merely "connected to" another component, the components may be directly connected to one another or another component(s) may be connected therebetween.

Furthermore, the terms first, second, third, etc., are used herein to designate particular elements such as chips. However, these elements are not limited by these terms. Rather, these terms are only used to distinguish one element from another.

An embodiment of a multi-channel package 100 according to the inventive concept will now be described in more detail with reference to FIG. 1 and FIG. 2.

The multi-channel package 100 includes a package substrate 110, a plurality of semiconductor chips 120a, 120b, 120c, and 120d mounted to the package substrate 110, a plurality of external connection terminals 130a, 130b, 130c, and 130d, and encapsulant 150 encapsulating the semiconductor chips 120a, 120b, 120c, and 120d.

The package substrate 110 may be any of various types of substrates such as a printed circuit board, a flexible substrate, or a tape substrate. In any case, the package substrate 110 has a substrate body including a first surface 114 and a second surface 116, and a plurality of bonding pads 112a, 112b, 112c, and 112d located on the first surface 114 of the substrate body of the package substrate 110. The semiconductor chips 120a, 120b, 120c, and 120d are disposed on the first surface 114 of the package substrate 110 and are electrically connected to the bonding pads 112a, 112b, 112c, and 112d.

In this example, the bonding pads 112a, 112b, 112c, and 112d are arranged along two edges only of the package substrate 110, but the inventive concept is not limited to such an arrangement of the bonding pads 112a, 112b, 112c, and 112d. Furthermore, in this example, the bonding pads 112a, 112b, 112c, and 112d are divided into at least four groups each associated with one of at least four channels, respectively. For example, the bonding pads 112a, 112b, 112c, and 112d consist of a first bonding pad group BG1 of first bonding pads 112a associated with a first channel, a second bonding pad group BG2 of second bonding pads 112b associated with a second channel, a third bonding pad group BG3 of third bonding pads 112c associated with a third channel, and a fourth bonding pad group BG4 of fourth bonding pads 112d associated with a fourth channel. Here, a channel refers to an independent or discrete path such as a bus along which commands or data (signals) are transmitted to/from corresponding semiconductor chips.

Figure 2:
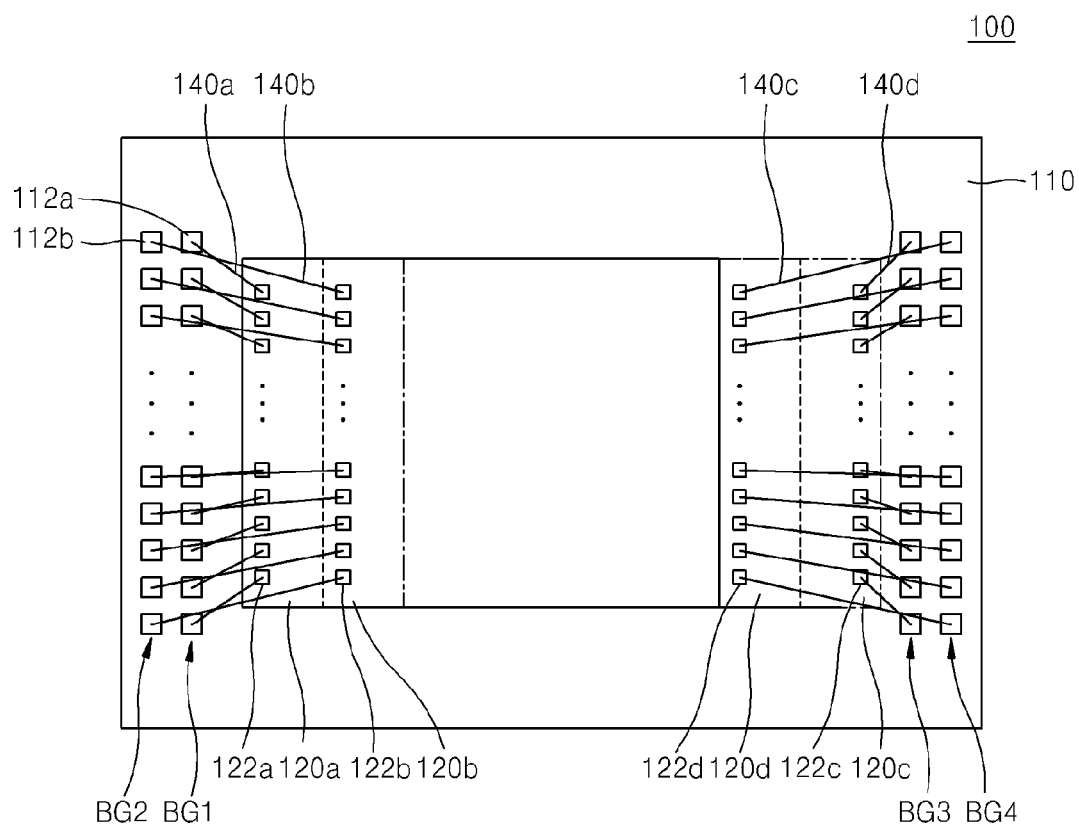
FIG. 2 is a plan view of the multi-channel package of FIG. 1.

Also, in the example illustrated in FIG. 2, the first bonding pads 112a and the second bonding pads 112b are arranged in respective series (rows) along one peripheral edge of the first surface 114 of the package substrate 110 (left edge in the figure), and the third bonding pads 112c and the fourth bonding pads 112d are arranged in respective series (rows) along the opposite peripheral edge of the first surface 114 of the package substrate 110 (right edge in the figure). However, the inventive concept is not limited to these serial arrangements of the bonding pads. For example, the first and second bonding pads 112a and 112b may be alternately disposed in a series (row) along one edge of the first surface 114 of the package substrate 110, and the third and fourth bonding pads 112c and 112d may be alternately disposed in a series (row) along another of the edges of the first surface 114 of the package substrate 110.

The package substrate 110 may also include a plurality of bump pads 115 at the second surface 116 thereof. In this case, the external connection terminals 130a, 130b, 130c, and 130d are coupled to the bump pads 115.

The external connection terminals 130a, 130b, 130c, and 130d may be bumps or solder balls. Also, the external connection terminals 130a, 130b, 130c, and 130d may be arrayed along the second surface 116 of the package substrate 110. Accordingly, the multi-channel package 100 may be a ball grid array (BGA) type of package.

Furthermore, the external connection terminals 130a, 130b, 130c, and 130d are divided into at least four groups corresponding to the channels, respectively. For example, the external connection terminals 130a, 130b, 130c, and 130d include a first external connection terminal group SG1 of first external connection terminals 130a, a second external connection terminal group SG2 of second external connection terminals 130b, a third external connection terminal group SG3 of third external connection terminals 130c, and a fourth external connection terminal group SG4 of fourth external connection terminals 130d. The first external connection terminal group SG1 is electrically connected to the first bonding pad group BG1 via the bump pads 115 and internal wiring/vias (not shown) of the package substrate 110, i.e., conductive paths extending within and through the substrate body of the package substrate 10. Likewise, the second external connection terminal group SG2 and the second bonding pad group BG2, the third external connection terminal group SG3 and the third bonding pad group BG3, and the fourth external connection terminal group SG4 and the fourth bonding pad group BG4 are also respectively electrically connected via the bump pads 115 and internal wiring/vias.

Each channel is dedicated to one or a group of the semiconductor chips. Therefore, the semiconductor chips 120a, 120b, 120c, and 120d correspond to at least four channels and may be divided into groups associated with the channels, respectively. For example, the semiconductor chips 120a, 120b, 120c, and 120d may include a first chip group CG1 of first semiconductor chips 120a to which a first channel is dedicated, a second chip group CG2 of second semiconductor chips 120b to which a second channel is dedicated, a third chip group CG3 of third semiconductor chips 120c to which a third channel is dedicated, and a fourth chip group CG4 of fourth semiconductor chips 120d to which a fourth channel is dedicated. In the illustrated embodiment, each chip group has only two semiconductor chips. However, the inventive concept is not limited to a package in which only two respective semiconductor chips are associated with each of at least four channels. For example, at least three semiconductor chips or only one semiconductor chip may be associated with each channel. Also, the relative locations of the semiconductor chips or groups CG1, CG2, CG3, CG4 of the chips may be different than what is illustrated in FIG. 2. For example, the first and third semiconductor chips in a direction away from the package substrate 110 may constitute the first chip group CG1, and the second and fourth semiconductor chips in a direction away from the package substrate 110 may constitute the second chip group CG2.

Furthermore, the semiconductor chips 120a, 120b, 120c, and 120d may be memory chips or logic chips. This includes the case in which some of the semiconductor chips 120a, 120b, 120c, and 120d are memory chips and the rest are logic chips. In the case in which any of the semiconductor chips 120a, 120b, 120c, and 120d is a memory chip, the memory chip may be a dynamic random access memory (DRAM), a static random access memory (SRAM), a flash memory, a phase-change random access memory (PRAM), a resistive random access memory (ReRAM), a ferroelectric random access memory (FeRAM), or a magnetoresistive random access memory (MRAM). In the example of the present embodiment, the semiconductor chips 120a, 120b, 120c, and 120d are all flash memory chips. Thus, memories of each group, i.e., flash memories of each group in this example, share a respective (single) channel. Accordingly, each group of flash memories that is connected to one of the channels may operate independently from the flash memories of each group that is connected to another of the channels.

The first through fourth semiconductor chips 120a, 120b, 120c, and 120d have first through fourth chip pads 122a, 122b, 122c, and 122d disposed along the periphery of upper surfaces of the chip bodies thereof, respectively. That is, first chip pads 122a are disposed on the body of each first semiconductor chip 120a, second chip pads 122b are disposed on the body of each second semiconductor chip 120b, third chip pads 122c are disposed on the body of each third semiconductor chip 120c, and fourth chip pads 122d are disposed on the body of each fourth semiconductor chip 120d. The first through fourth chip pads 122a, 122b, 122c, and 122d may allow signals to be input and/or output to internal circuits of the first through fourth semiconductor chips 120a, 120b, 120c, and 120d.

In this example, the first through fourth chips groups CG1, CG2, CG3, CG4 form a cascading type of offset stack structure. The first through fourth chip pads 122a, 122b, 122c, and 122d are exposed due to this offset arrangement. Also, in this example, the (horizontal) direction in which the chips of the first and second chip groups CG1 and CG2 are offset in the stack from each other is opposite to the (horizontal) direction in which the chips of the third and fourth chip groups CG3 and CG4 are offset from each other in the stack. Furthermore, given that the amounts of horizontal offset between adjacent ones of the chips may be equal throughout the stack, an arrangement may be realized in which a fourth semiconductor chip 120d is vertically juxtaposed in precise alignment with a second semiconductor chip 120b.

The multi-channel chip package 100 of this embodiment also includes first through fourth connectors 140a, 140b, 140c, 140d by which the chip(s) associated with the channels, respectively, are electrically connected to the bonding pad groups BG1, BG2, BG3, BG4, respectively, via the first through fourth chip pads 122a, 122b, 122c, 122d, respectively. Using the first connectors 140a of the illustrated embodiment as an example, the first semiconductor chips 120a of the first chip group CG1 are electrically connected to the first bonding pads 112a of the first bonding pad group BG1 via the first chip pads 122a and the first connectors 140a. Also, in this example, the first through fourth connectors 140a, 140b, 140c, and 140d are metal wires.

The encapsulant 150 is disposed on the package substrate 110 and covers the first through fourth semiconductor chips 120a, 120b, 120c, and 120d. More specifically, the encapsulant 150 encapsulates the first through fourth semiconductor chips 120a, 120b, 120c, and 120d to protect the same from external physical impacts and/or chemicals. To this end, the encapsulant 150 may be an epoxy molding compound (EMC).

According to the multi-channel package as described above, signals can be separately input or output to/from each of the first through fourth chips. That is, signals may be separated into four channels to be input or output to/from semiconductor chips, respectively. Accordingly, if a defect occurs in a chip or chip group, just that chip or chip group may be treated as a defect and not the entire multi-channel package. In addition, the multi-channel package can operate at a remarkably high speed because signals can be separately transmitted to the first through fourth chips. This advantages is more pronounced when the inventive concept is embodied as a BGA package, compared to a lead frame package, because BGA packages have a relatively large number of terminals through which signals are transmitted.

Hereinafter, representative reference numerals may be used for like elements for conciseness and ease of description. For instance, any of the first through fourth semiconductor chips 120a, 120b, 120c, and 120d may be simply referred to as a semiconductor chip 120, any of the first through fourth bonding pads 112a, 112b, 112c, and 112d may be referred to as a bonding pad 112, any of the first through fourth external connection terminals 130a, 130b, 130c, and 130d may be referred to as an external connection terminal 130, any of the first through fourth chip pads 122a, 122b, 122c, and 122d may be referred to as a chip pad 122, and any of the first through fourth connectors 140a, 140b, 140c, 140d may be referred to as a connector 140.

Figure 3:
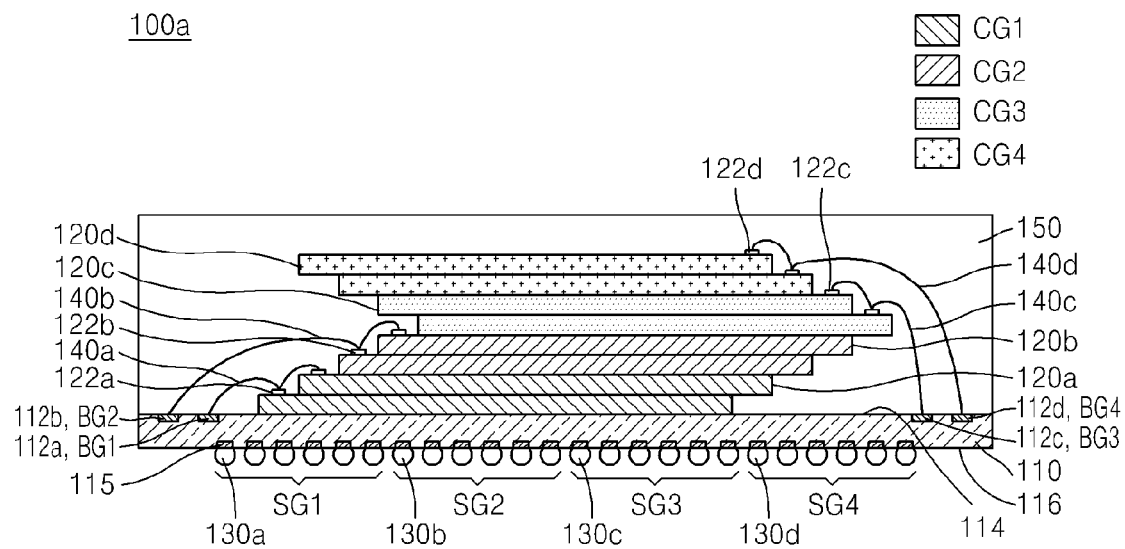
FIG. 3 is a cross-sectional view of another embodiment of a multi-channel package according to the inventive concept.

Another embodiment of a multi-channel package 100a according to the inventive concept will now be described with reference to FIG. 3.

The multi-channel package 100a is similar to the multi-channel package 100 of the embodiment of FIGS. 1 and 2, but differs in regard to its wiring connection. That is, in the multi-channel package 100a, connectors 140 extend from the chip pads 122 of only one of the semiconductor chips 120 constituting a chip group CG. The chip pads of the other semiconductor chip(s) 120 of that chip group CG are directly connected to the chip pads of the semiconductor chip 120 adjacent thereto in the stack by separate individual wires. In the embodiment of FIG. 3, using the first semiconductor chip group CG1 as an example, a chip pad 122 of a lower semiconductor chip 120a of the first semiconductor chip group CG1 is directly connected to a first bonding pad 112a via a first connector 140, and a chip pad 122 of an upper semiconductor chip 120a is directly connected to the chip pad 122 of the lower semiconductor chip 120a of the first semiconductor chip group CG1 via a separate wire so as to be connected to the first bonding pad 112a via those two wires.

The above-described connection structure minimizes the lengths of the connectors 140 and simplifies the arrangement of the multi-channel package. Furthermore, a phenomena known as wire sweeping is less likely to occur because the loop height of the connector 140 is minimal.

Another embodiment of a multi-channel package 100b according to the inventive concept will now be described with reference to FIG. 4. Those aspects/features of this embodiment which are similar to those of the embodiment of FIG. 1 will be not be described in detail for the sake of brevity.

Figure 4:
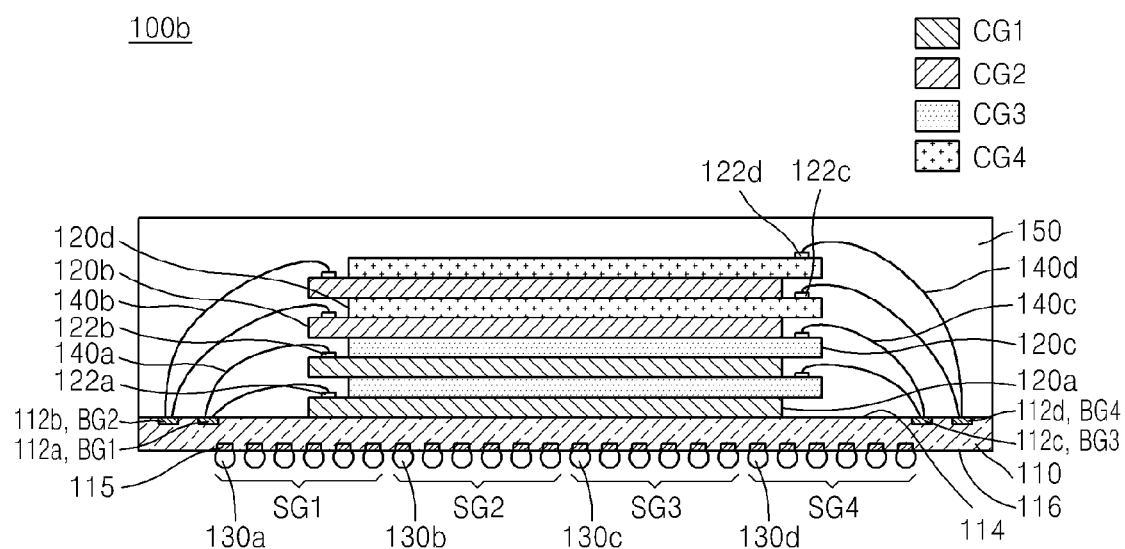
FIG. 4 is a cross-sectional view of another embodiment of a multi-channel package according to the inventive concept.

Referring to FIG. 4, the semiconductor chips 120 of the multi-channel package 100b are arranged to alternately protrude on opposite sides of the stack. That is, the semiconductor chips 120 of the multi-channel package 100b form a zigzag type of stack structure. For example, the first semiconductor chips 120a may be the first and third chips disposed on the substrate 110, the second semiconductor chips 120b may be the fifth and seventh chips disposed on the substrate 110, the third semiconductor chips 120c may be the second and fourth chips disposed on the substrate 110, and the fourth semiconductor chips 120d may be the sixth and eighth chips disposed on the substrate 110. In this case, the first and second semiconductor chips 120a and 120b may be vertically aligned, the third and fourth semiconductor chips 120c and 120d may be vertically aligned, and the aligned first and second semiconductor chips 120a and 120b may be (horizontally) offset from the aligned third and fourth semiconductor chips 120c and 120d. All of the chip pads 122 are exposed due to the offset arrangement such that the chip pads 122 can be readily connected to corresponding bonding pads 112 via connectors 140, respectively.

Figure 5:
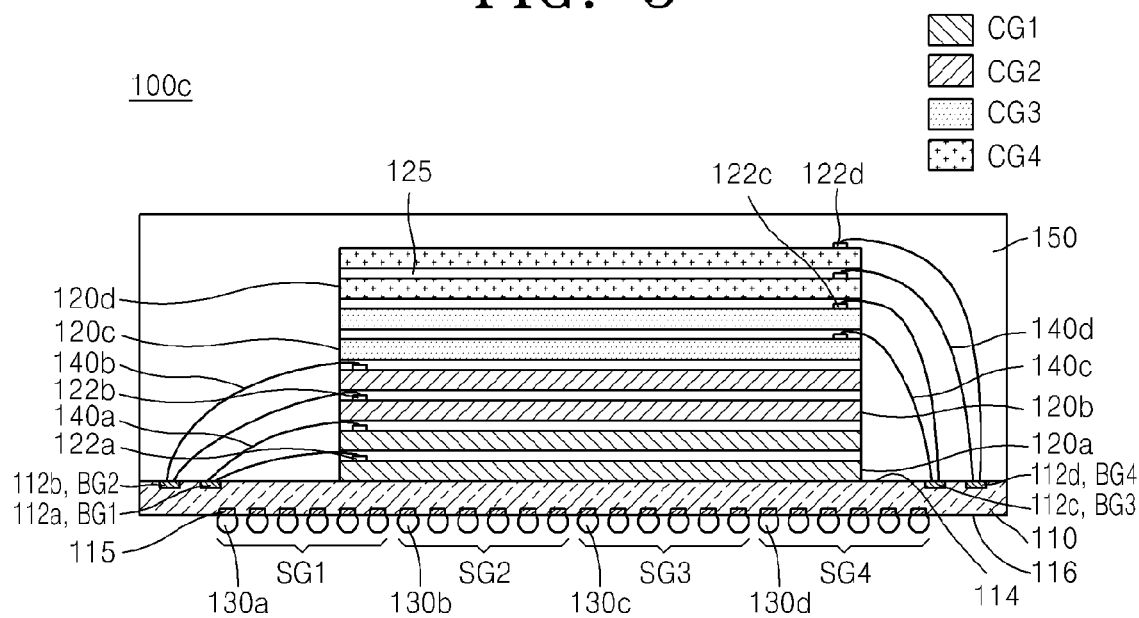
FIG. 5 is a cross-sectional view of another embodiment of a multi-channel package according to the inventive concept.

Another embodiment of a multi-channel package 100c according to the inventive concept will now be described with reference to FIG. 5.

The multi-channel package 100c includes an adhesive layer or an underfill 125 interposed between adjacent ones of the semiconductor chips 120 in the stack. In this embodiment, the semiconductor chips 120 are vertically aligned and may be of the same size such that the peripheral surfaces of each chip are aligned with the peripheral surfaces of each of the other chips.

The underfill 125 provides space between adjacent semiconductor chips. Thus, the chip pads 122 of the semiconductor chips 120 may be respectively connected to corresponding bonding pads 112 via connectors 140. The connections between the semiconductor chips 120 and the bonding pads 112 may be configured similarly to those illustrated in FIG. 1.

In another example of this embodiment, the first through fourth semiconductor chips 120a, 120b, 120c, and 120d are offset in the manner described with reference to the embodiment of FIG. 4. This provides greater distances between adjacent connectors 140, thereby reducing the likelihood that wire sweeping will occur.

Figure 6:
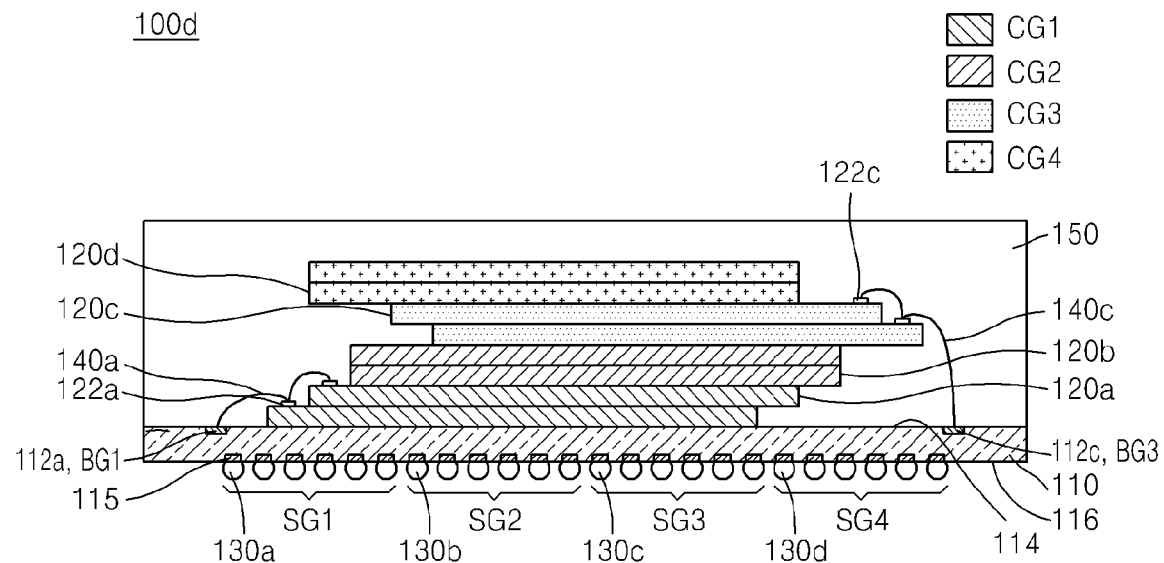
FIG. 6 is a cross-sectional view of another embodiment of a multi-channel package according to the inventive concept.
Figure 7:
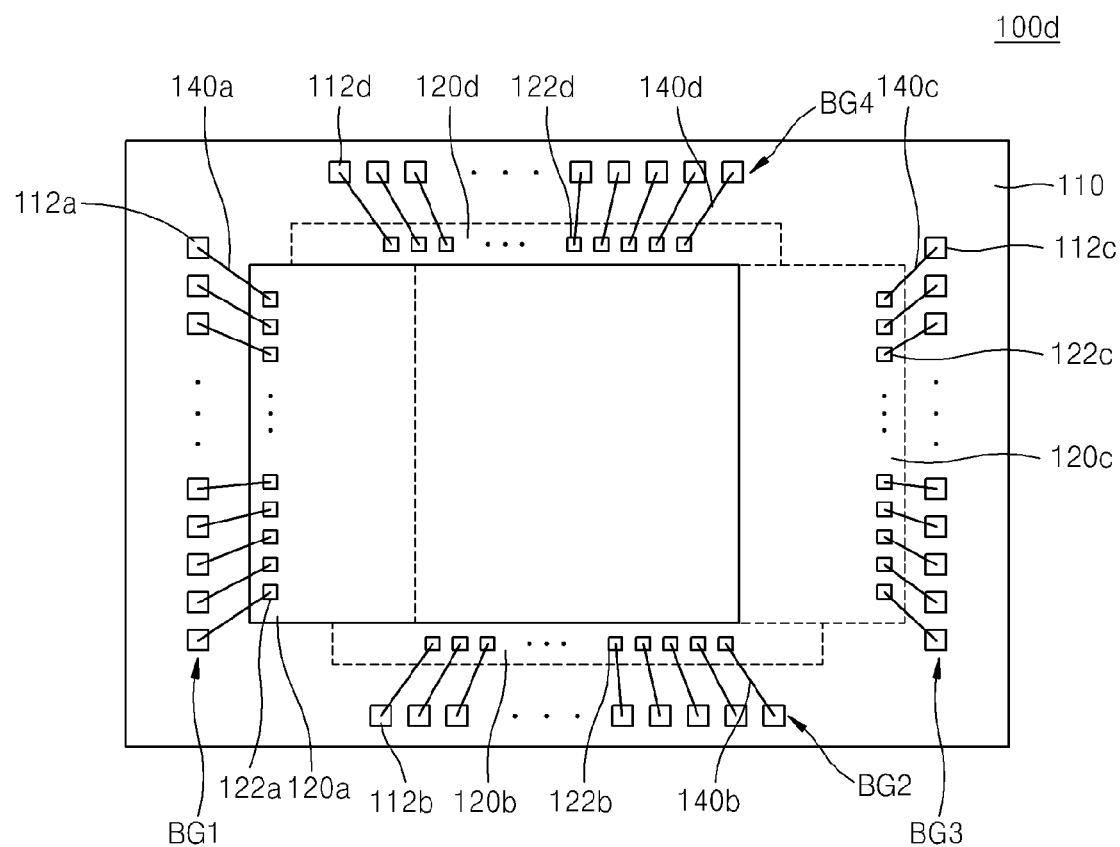
FIG. 7 is a plan view of the multi-channel package of FIG. 6.

Another embodiment of a multi-channel package 100d according to the inventive concept will now be described with reference to FIGS. 6 and 7. Most notably, the multi-channel package 100d is different from the multi-channel packages of the above-described embodiments in terms of the stacked structure formed by the semiconductor chips 120, the configuration of the connections formed by the connectors 140, and the positions of the bonding pads 112. Otherwise, the features/aspects of this embodiment are similar to those of the embodiment of FIG. 1 and will not be described in detail.

In the multi-channel package 100d according to the inventive concept, the bonding pads 112 are disposed along the four sides of the package substrate 110. For example, as illustrated in FIG. 7, the first bonding pads 112a are disposed along a left side of the package substrate 110; the second bonding pads 112b are disposed along a front side of the package substrate 110; the third bonding pads 112c are disposed along a right side of the package substrate 110; and the fourth bonding pads 112d are disposed along a back side of the package substrate 110.

Meanwhile, four pairs of semiconductor chips 120 are (horizontally) offset in the stack in left, right, front, and back directions, respectively. Also, the chips 120 of each pair are (horizontally) offset from each other in a respective one of the left, right, front, and back directions. For example, two first semiconductor chips 120a are stacked with the upper chip offset from the lower chip in a right direction, two third semiconductor chips 120c are stacked with the upper chip offset from the lower chip in a left direction, two second semiconductor chips 120b are stacked with the upper chip offset from the lower chip in the front direction, and two fourth semiconductor chips 120d are stacked with the upper chip offset from the lower chip in the back direction.

Accordingly, the chip pads 122 of the semiconductor chips 120 are exposed at the right, left, front and back sides of the stack. More specifically, chip pads 122a of the first semiconductor chips 120a are provided at the left sides of the first semiconductor chips 120a and are exposed at a left side of the stack; chip pads 122b of the second semiconductor chips 120b are provided at the front sides of the second semiconductor chips 120b and are exposed at the front side of the stack; third chip pads 122c of the third semiconductor chips 120c are provided at the right sides of the third semiconductor chips 120c and are exposed at the right side of the stack; and fourth chip pads 122d of the fourth semiconductor chips 120d are provided at the back sides of the fourth semiconductor chips 120d and are exposed at the back side of the stack. Therefore, the chip pads 122 may be readily connected to corresponding bonding pads 112 via connectors 140 in a manner similar to that shown in and described with reference to FIG. 1 or, as illustrated, in a manner similar to that shown in and described with reference to FIG. 3.

Another embodiment of a multi-channel package 100e according to the inventive concept will now be described with reference to FIGS. 8 and 9. As in the detailed description of the previous embodiments, features/aspects of this embodiment which are shown in the figures and are similar to those described above will not be described again in further detail.

Figure 8:
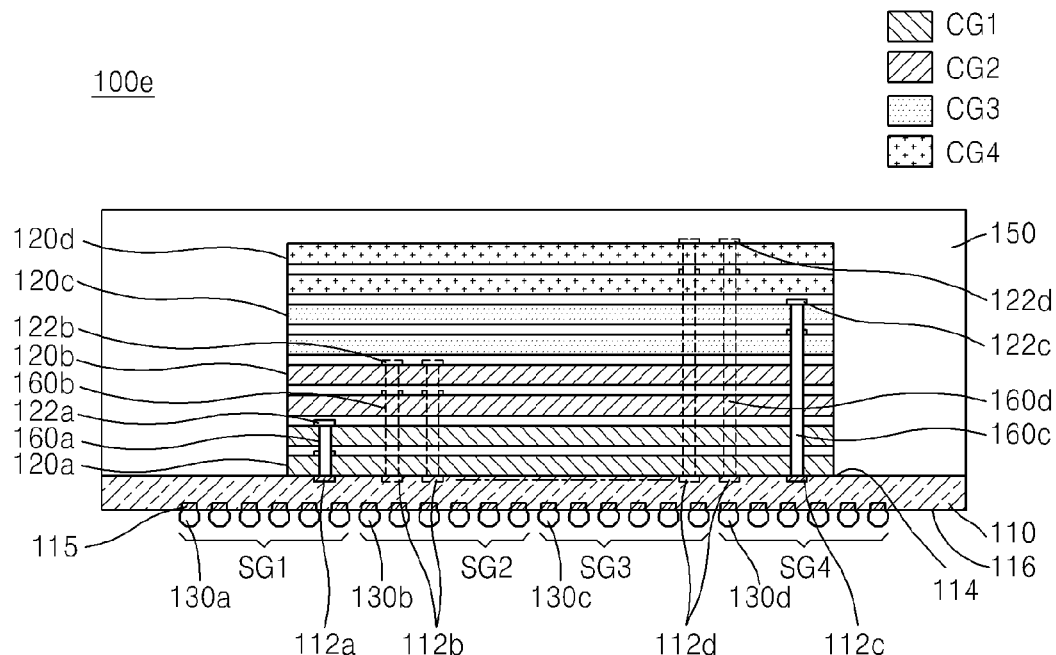
FIG. 8 is a cross-sectional view of yet another embodiment of a multi-channel package according to the inventive concept.
Figure 9:
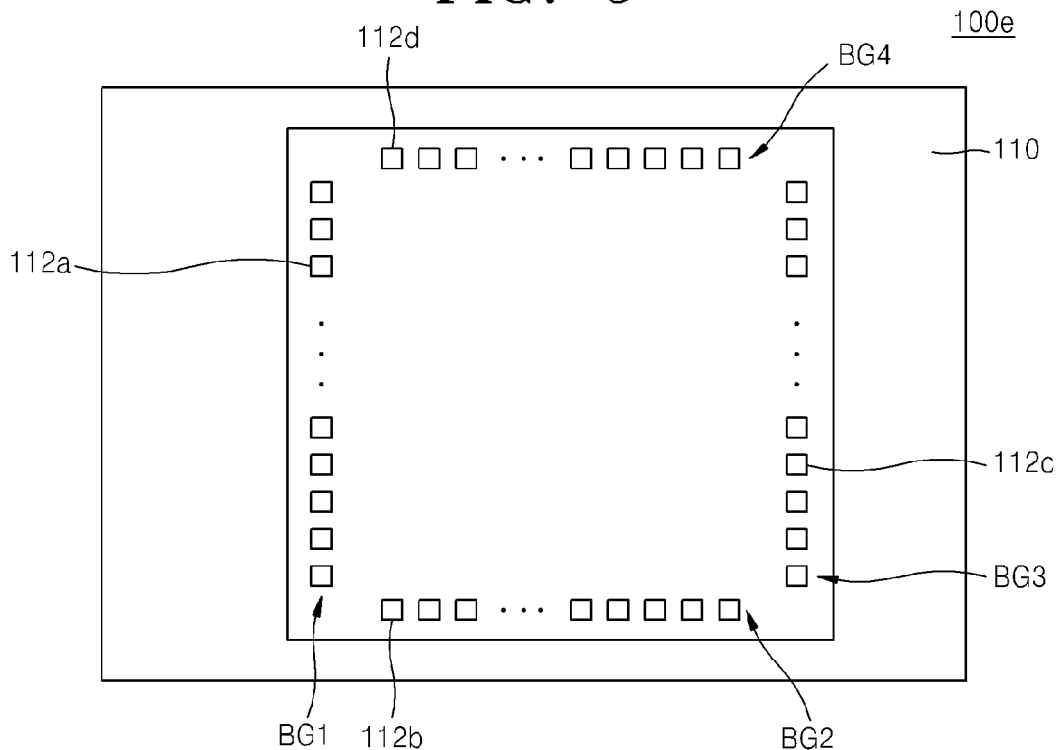
FIG. 9 is a plan view of the packages substrate of the multi-channel package of FIG. 8, illustrating the layout of bonding pads of the package substrate.

Referring to FIGS. 8 and 9, in the multi-channel package 100c, semiconductor chips 120 are stacked by using adhesive layers or underfill 125 therebetween. Also, the connectors that connect the chip pads 122 and the bonding pads 112 are silicon vias (TSVs) 160a, 160b, 160c, and 160d.

More specifically, as best shown in FIG. 9, in this example, the bonding pads 112 are disposed along four edge sides of the package substrate 110. Furthermore, chip pads 122a of the first semiconductor chips 120a are provided along left sides of the first semiconductor chips 120a, chip pads 122b of the second semiconductor chips 120b are provided along front sides of the second semiconductor chips 120b, chip pads 122c of the third semiconductor chips 120c are provided along right sides of the third semiconductor chips 120c, and chip pads 122d of the fourth semiconductor chips 120d are provided along back sides of the fourth semiconductor chips 120d. Still further, the TSVs 160a, 160b, 160c, and 160d have different lengths. In this respect, first TSVs 160a pass through only two chips, namely, the first semiconductor chips 120a, to connect the first chip pads 122a of the first semiconductor chip 120a to the first bonding pads 112a. Second TSVs 160b (only two of which are shown in FIG. 8) pass through only four chips, namely, semiconductor chips 120a and 120b, to connect the second chip pads 122b of the second semiconductor chips 120b to the second bonding pads 112b. Third TSVs 160c pass through only six chips, namely, semiconductor chips 120a, 120b and 120c, to connect the third chip pads 122c of the third semiconductor chips 120c to the third bonding pads 112c. And fourth TSVs 160d (only two of which are also shown in FIG. 8) pass through all eight chips, namely, semiconductor chips 120a, 120b, 120c and 120d, to connect the fourth chip pads 122d of the fourth semiconductor chips 120d to the fourth bonding pads 112d.

In another example of this embodiment, all of the TSVs 160a, 160b, 160c, and 160d pass through each of the semiconductor chips 120 like the fourth TSVs 160d. In this case, the TSVs 160a, 160b, 160c, and 160d may be formed at once after all of the semiconductor chips 120 have been stacked. Accordingly, the packaging process is relatively simple so that time and costs are saved.

In some instances, dummy pads may be provided on the semiconductor chips 120, and the TSVs 160 are formed to extend through the dummy pads. Dummy pads refer to conductive pads that are not electrically connected to circuits of the semiconductor chips 120. For example, dummy pads may be provided on the left sides of the second through fourth semiconductor chips 120b, 120c, and 120d so that the first TSVs 160a pass through the first chip pads 122a of the first semiconductor chips 120a and the dummy pads of the second through fourth semiconductor chips 120b, 120c, and 120d. In this case, the dummy pads may be used to align the semiconductor chips 120 while the semiconductor chips 120 are being stacked.

Figure 10:
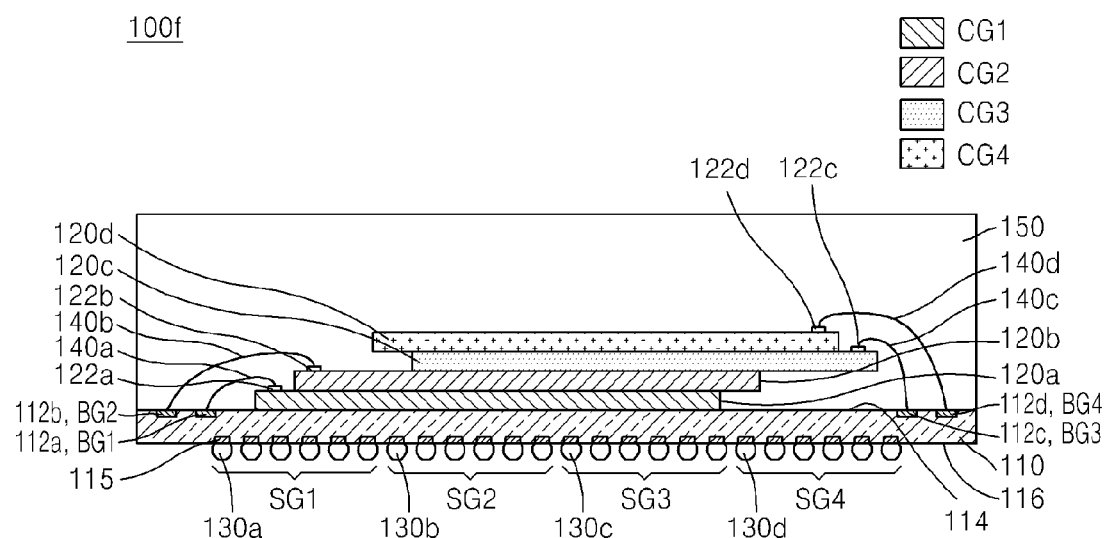
FIG. 10 is a cross-sectional view of another embodiment of a multi-channel package according to the inventive concept.

Another embodiment of a multi-channel package 100f according to the inventive concept will be described with reference to FIG. 10. In this embodiment, as was mentioned above, only one semiconductor chip 120 is associated with each at least four channels. Furthermore, each chip may be (horizontally) offset relative to the chip on which it is directly disposed.

Figure 11:
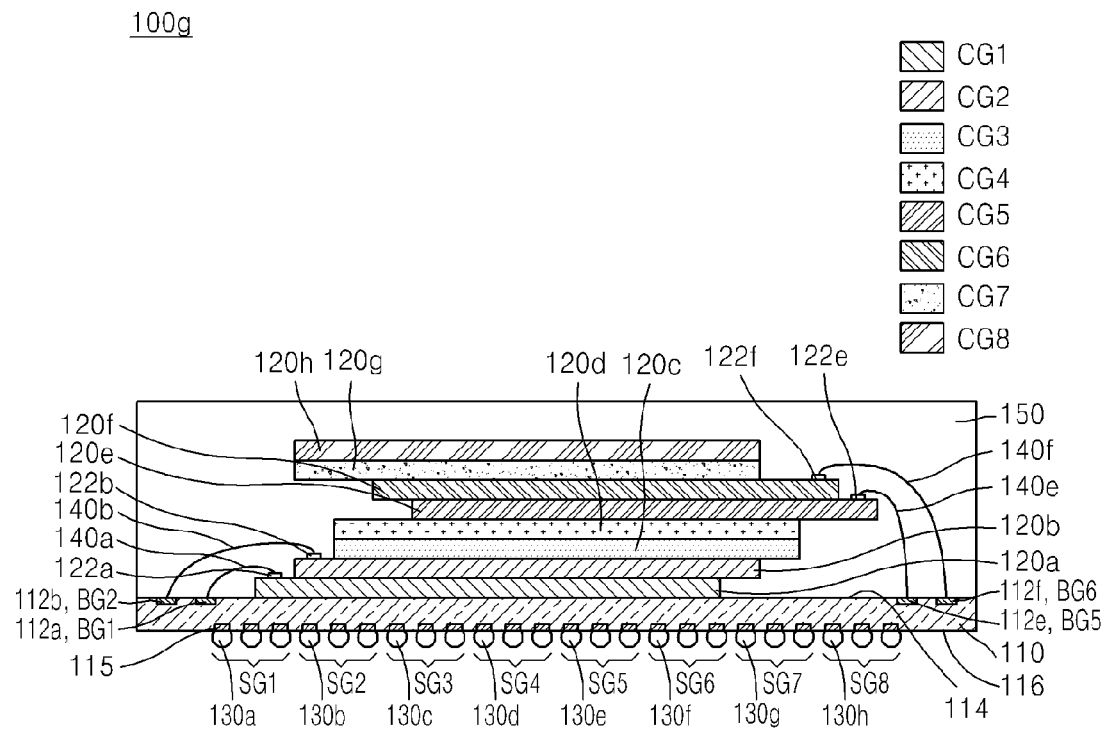
FIG. 11 is a cross-sectional view of another embodiment of a multi-channel package according to the inventive concept.

Yet another embodiment of a multi-channel package 100g according to the inventive concept will be described with reference to FIG. 11.

The multi-channel package 100g of this embodiment has more than four channels. In this embodiment, the multi-channel package 100g has eight chips or chip groups, eight bonding pad groups, and eight external connection terminal groups. More specifically, in the illustrated example of this embodiment, each of eight semiconductor chips 120a through 120h is associated with a respective channel.

Furthermore, the chips 120 are stacked and the bonding pads 112 are disposed on package substrate 110 in a manner similar to that shown in and described with reference to FIGS. 6 and 7. However, in this case, two rows bonding pads 112 are provided along each of four sides of the package substrate 110, and the chip pads 122 of each of the eight semiconductor chips 120 are connected to the bonding pads 112 of a respective one of the rows thereof via connectors 140.

Figure 12:
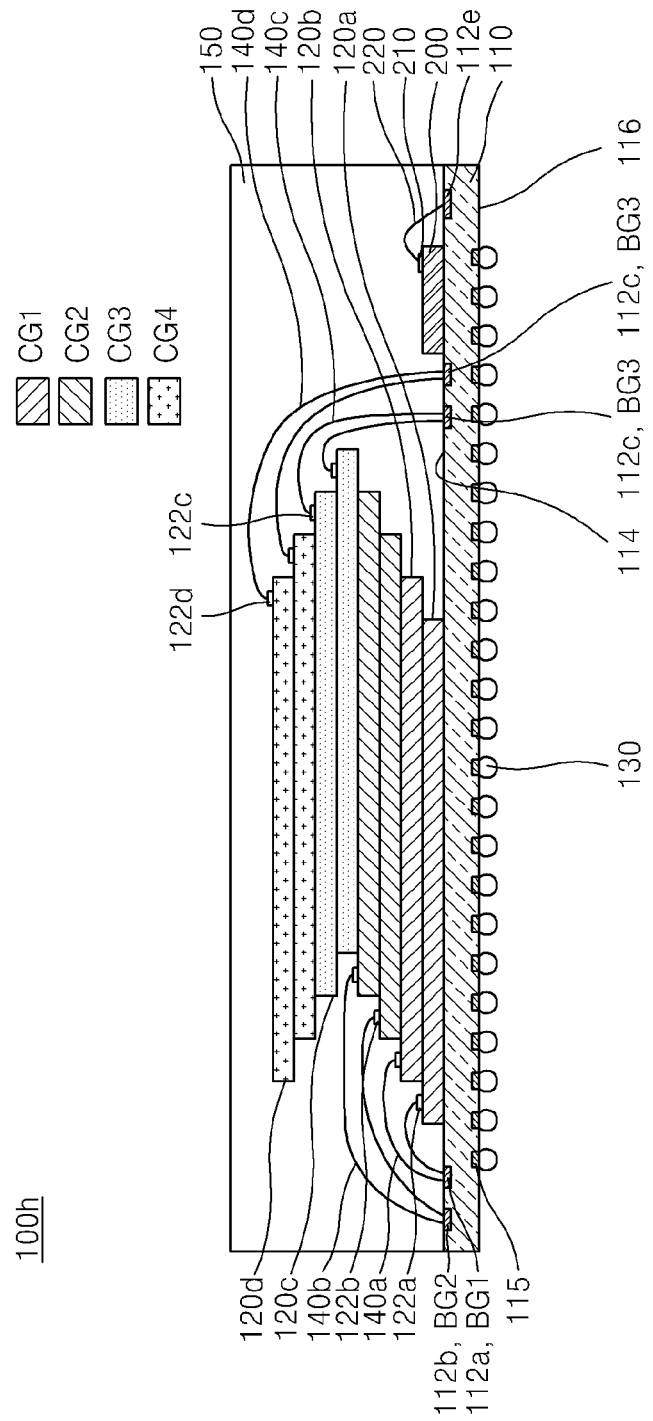
FIG. 12 is a cross-sectional view of yet another embodiment of a multi-channel package according to the inventive concept.
Figure 13:
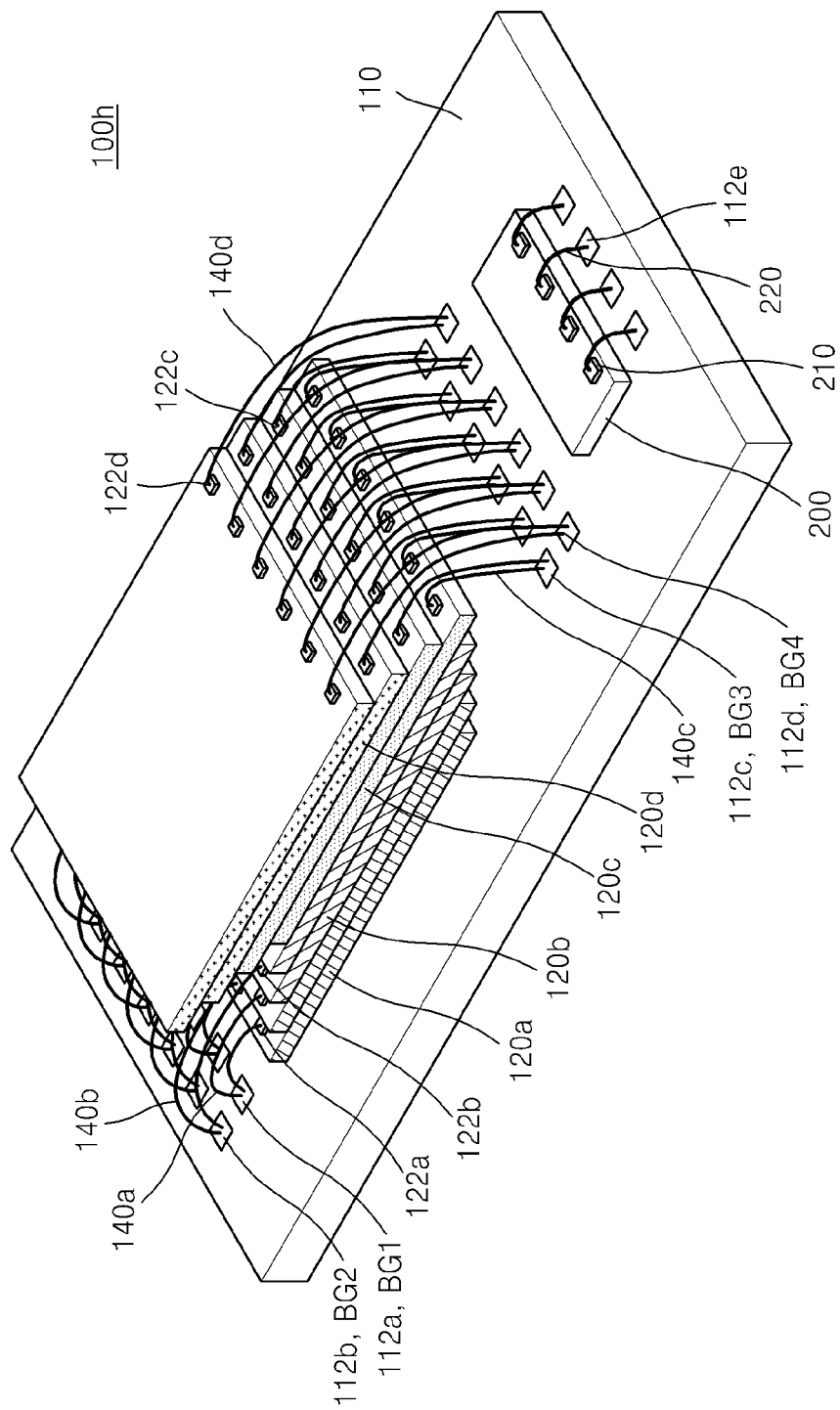
FIG. 13 is a perspective view of the multi-channel package of FIG. 12.

Another embodiment of a multi-channel package 100h according to the inventive concept will be described with reference to FIGS. 12 and 13.

The multi-channel package 100h includes at least one embedded control chip 200 mounted on the first surface 114 of package substrate 110. For example, a respective embedded control chip 200 may be provided for each channel, or for every two channels, or for every four channels. In the example of the current embodiment, four channels are provided, and one embedded control chip 200 is provided for the four channels.

The embedded control chip(s) 200 controls the semiconductor chips 120. For example, the embedded control chip 200 may perform error correction code (ECC) and flash translation layer (FTL) processing to increase the performance and reliability of memories constituted by the chips 120. Here, FTL processing may include logical/physical address translation, wear leveling, garbage collection, bad block management or control.

In addition, the embedded control chip 200 allows the multi-channel package 100h to be used in an external memory card.

Also, in the example of this embodiment, the package substrate 110 has control chip bonding pads 112e disposed on first surface 114 of the substrate body thereof, and the embedded control chip 200 has control chip pads 210 electrically connected to the control chip bonding pads 112e via connectors, that is, control chip bonding wires 220. The control chip bonding pads 112e may be electrically connected to the bonding pads 112 of the package substrate 110 via internal wings of the package substrate 110. Accordingly, the first through fourth semiconductor chips 120a, 120b, 120c, and 120d may be electrically connected to the embedded control chip 200. Also, the embedded control chip 200 may be electrically connected to external connection terminals 130 via the control chip bonding pads 112e.

Still further, the external connection terminals 130 disposed on the second surface 116 of package substrate 110 do not have to be arranged in groups associated with the first through fourth chip groups CG1, CG2, CG3, and CG4, respectively, in this embodiment. Rather, the first through fourth chip groups CG1, CG2, CG3, and CG4 may still be respectively connected to first through fourth bonding groups BG1, BG2, BG3, and BG4 of the package substrate 110 via the embedded control chip(s). Accordingly, the connections to the first through fourth chip groups CG1, CG2, CG3, and CG4 via the embedded control chip(s) 200 may be controlled to cut off a chip group(s) that is/are defective.

Figure 14:
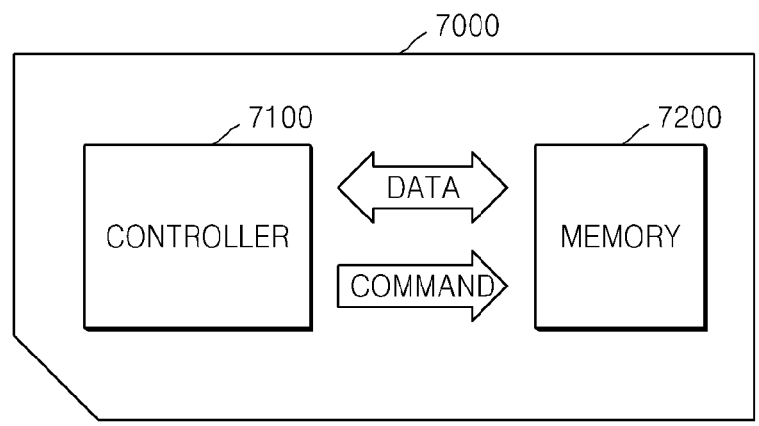
FIG. 14 is a block diagram of a memory card according to the inventive concept.

A memory card 7000 according to the inventive concept will be described with reference to FIG. 14. The memory card 7000 may be a memory stick card, a smart media card (SM), a secure digital (SD), a mini secure digital card (mini SD), or a multi media card (MMC).

The memory card 7000 includes a controller 7100, and a memory 7200 operatively connected to the controller 7100 to be controlled by the controller 7100. For example, when the controller 7100 issues a command, the memory 7200 may transmit data. The memory 7200 may include a memory array (not shown) or a memory array bank (not shown). The controller 7100 and/or the memory 7200 include(s) a multi-channel package of any of the types described above with reference to FIGS. 1 through 13.

Figure 15:
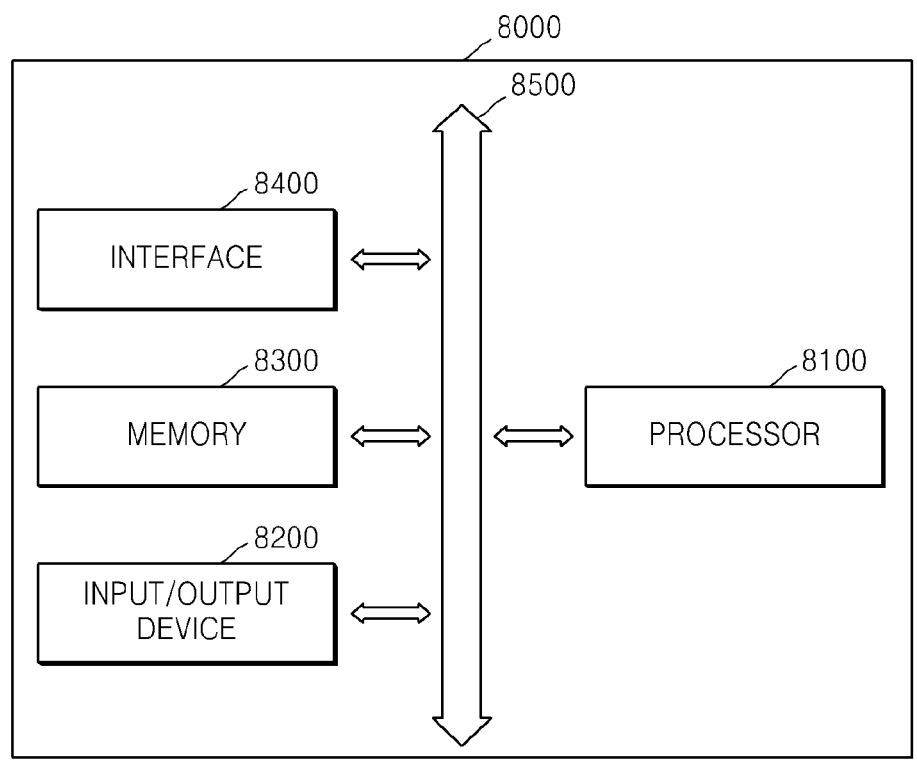
FIG. 15 is a block diagram of an electronic system according to the inventive concept.

An electronic system 8000 according to the inventive concept will now be described with reference to FIG. 15. The electronic system 8000 may be employed by a mobile system such as a personal digital assistant (PDA), a portable computer, a web tablet, a wireless phone, a mobile pone, a digital music player such as an MP3 player, or a memory card. The electronic system 8000 may also be used in a navigation device, a portable multimedia player (PMP), or a solid state drive (SSD), or in household appliances.

The electronic system 8000 of this embodiment includes a controller 8100, an input/output device 8200, a memory 8300, and an interface 8400. The electronic system 8000 may also include a bus 8500 via which the controller 8100, the input/output device 8200, the memory 8300, and the interface 8400 communicate with one another.

The controller 8100 executes programs and controls the electronic system 8000. The controller 8100 is, for example, a microprocessor, a digital signal processor, a microcontroller, or the like. The input/output device 8200 is configured to input or output data to or from the electronic system 8000. In this respect, the input/output device 8200 may be a keypad, a keyboard, or a display. The electronic system 8000 may be connected by the input/output device 8200 to an external apparatus such as a personal computer or a network so as to exchange data with the external apparatus.

The memory 8300 may store code and/or data for operating the controller 8100 and/or store the data processed by using the controller 8100. The controller 8100 and the memory 8300 may include a multi-channel package of any of the types described with reference to FIGS. 1 through 13.

The interface 8400 provides a data transmission path between the electronic system 8000 and another external device or devices.

In addition, the operational speed of the electronic system 8000 is relatively high because the multi-channel package according to the inventive concept includes four channels. This will be described in more detail below with reference to FIGS. 16 through 22.

An electronic system according to the inventive concept and embodied as an SSD 1000 will now be described with reference to FIGS. 16 and 17.

The SSD 1000 includes at least one multi-channel package 100 according to the inventive concept, an SSD controller 3000, a DRAM 400, and a main board 500. Furthermore, the SSD 1000 may include an interface 520 for communicating with an external device. The interface 520 may be formed at one side of the main board 500.

The multi-channel package(s) 100 is/are mounted on the main board 500 via external connection terminals (130) with reference to the previous figures. The connection terminals may be bumps or solder balls in a ball grid array (BGA). However, the multi-channel package 100 may be embodied in other ways concerning the manner in which it is mounted to the main board 500. For example, the multi-channel package 100 may be realized in the form of a pin grid array (PGA) package, a tape carrier package (TCP), a chip-on-board (COB) structure, a quad flat non-leaded (QFN) structure, or a quad flat package (QFP).

Figure 16:
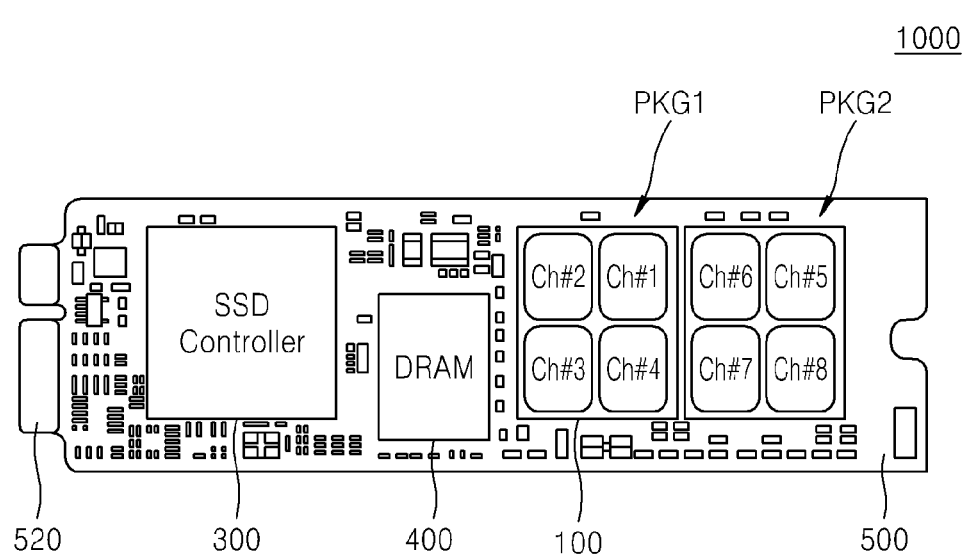
FIG. 16 is a plan view of an example of a solid state drive (SSD) according to the inventive concept.
Figure 17:
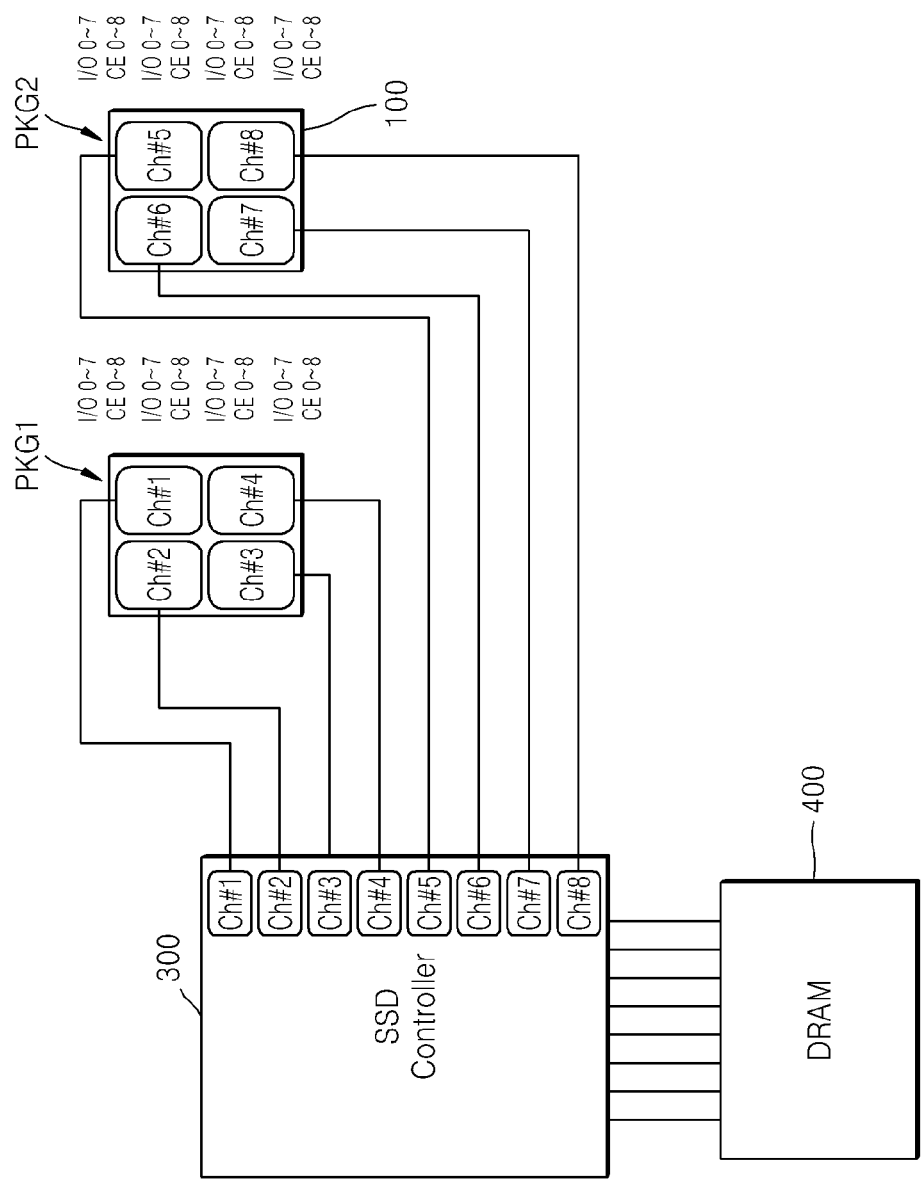
FIG. 17 is a block diagram of the SSD of FIG. 16.

In the embodiment illustrated in FIGS. 16 and 17, two multi-channel packages PKG1 and PKG2 are provided. That is, if the SSD controller 300 supports eight or more channels, two or more multi-channel packages 100 may be provided.

In any case, each channel of the multi-channel package 100 includes a signal terminal. The signal terminals may be external connection terminals. In FIG. 17, I/O 0-7 denote eight input/output terminals, and data, address, and command signals are input or output via the input/output terminals I/O 0-7. On the other hand, CE 0-8 are terminals through which control signals, e.g., nRE (read enable), CLE (command latch enable), ALE (address latch enable), nWP (write enable), nWP (write protect), R/B 1 (read/busy out), R/B 2, nCE 1 (chip enable), or nCE 2, are transmitted. In addition to the I/O terminals and the CE terminals, each channel may include a Vcc terminal through which power is supplied and a Vss terminal through which a ground voltage is applied. Also, each channel may further include a not connected (N.C.) dummy terminal which is not connected to any circuit.

As briefly alluded to above, the SSD controller 300 may include eight channels as illustrated in FIG. 17, and which are respectively connected to respective channels of the multi-channel packages PKG1 and PKG2 to control semiconductor chips of the multi-channel packages PKG1 and PKG2. However, the inventive concept may be applied to an SSD whose SSD controller 300 includes fewer or greater than eight channels. For example, the SSD controller 300 may include sixteen channels, and in this case, four multi-channel packages each including four channels may be provided or two multi-channel packages each including eight channels may be provided.

The SSD controller 300 may include a program via which a signal may be transmitted or received to/from an external device according to any serial advanced technology attachment (SATA) standard, parallel advanced technology attachment (PATA) standard, or small computer system interface (SCSI) standard. The SATA standards referenced may include not only the so-called SATA-1 standard but also the SATA-2, SATA-3, and e-SATA (external SATA) standards. The PATA standards referenced include all kinds of integrated drive electronics (IDE) standards such as IDE standards, and enhanced-IDE (E-IDE) standards.

In addition, the SSD controller 300 may perform EEC or FTL processing. The SSD controller 300 may also be embodied as a package mounted on the main board 500. In this respect, the SSD controller 300 may be realized in a package form like that of the multi-channel package 100, i.e., may be realized as a BGA package, a PGA package, a TCP structure, a COB structure, a QFN structure, or a QFP.

The DRAM 400 is an auxiliary memory device and may function as a buffer in terms of the exchanging of data between the SSD controller 300 and the multi-channel package 100. The DRAM 400 may also be embodied as a package mounted to the main board 500 and so, may be in the form of a BGA package, a PGA package, a TCP structure, a COB structure, a QFN structure, or a QFP, etc.

The main board 500 may be a printed circuit board, a flexible printed circuit board, a tape substrate, or the like. The main board 500 may include a core (not shown) having upper and lower surfaces and a resin layer (not shown) formed on each of the upper and lower surfaces of the core. Also, the printed circuit board may have a multi-layered structure in which a signal layer, a ground layer, and a power layer, that form wiring patterns, are interposed between the outermost resin layers. An additional wiring pattern may be formed on one or both of the outermost resin layers. In FIG. 16 the minute patterns shown on the main board 500 illustrate may such a wiring pattern. Alternatively, these markings may denote various passive electronic components.

As illustrated in FIG. 17, channels of the SSD controller 300 are respectively connected to corresponding channels of the multi-channel package 100, and thus data input to and output from the semiconductor chips of the multi-channel package 100 may be controlled in parallel. Also, as described above, in this example of an electronic system, each multi-channel package 100 includes four channels, and two multi-channel packages providing eight channels are mounted on the main board 500.

If the memory packages of the SSD of this example were to have only one or two channels, four or eight memory packages would have to be mounted to the SSD controller. In such a case, the wiring between the memory package and the SSD controller would have to be relatively long and thus, would offer an impediment with regard to the high speed operation of the SSD. For example, if four two channel memory packages were arranged in a row, and the memory packages were of the same size as those of the multi-channel packages PKG1 and PKG2 of the current embodiment, the wires leading to the third and fourth two channel memory packages from the SSD controller, especially the wires leading to the fourth two channel memory package located away from the SSD controller 300, would hinder a high speed operation of the SSD.

In addition to facilitating a high speed operation of the SSD, the memory packages according to the inventive concept can help realize smaller products without compromising their integration density.

Another example of an SSD 1000a according to the inventive concept will be described with reference to FIGS. 18 and 19. However, those features/aspects of the SSD 1000a which are similar to those of the embodiment of FIGS. 16 and 17 will not be described in complete detail hereinafter, for the sake of brevity.

Figure 18:
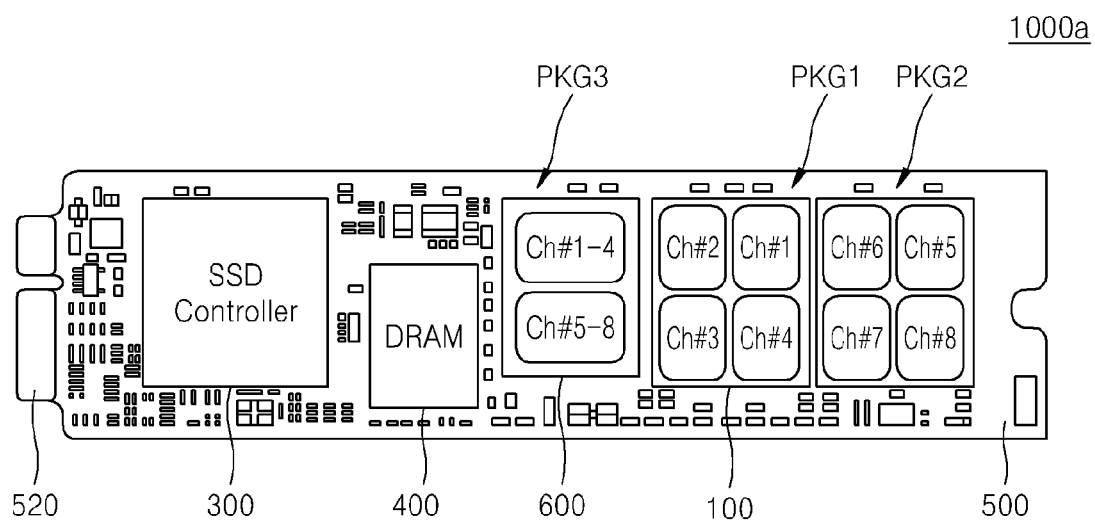
FIG. 18 is a plan view of another example of an SSD according to the inventive concept.
Figure 19:
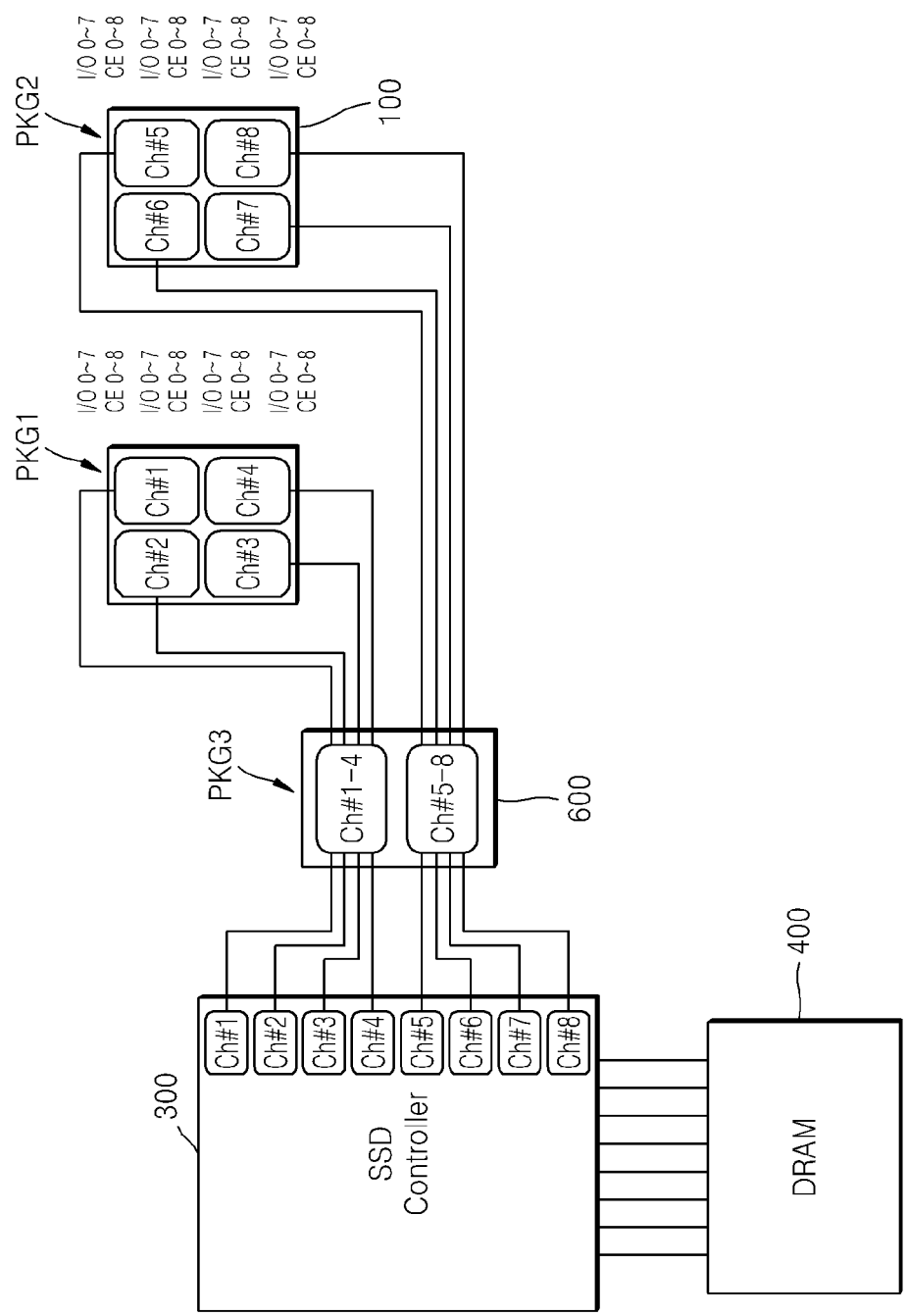
FIG. 19 is a block diagram of the SSD device of FIG. 18.

Referring to FIGS. 18 and 19, the SSD device 1000a is similar to the SSD device 1000 of FIGS. 16 and 17 but further includes a memory controller package PKG3 600. The memory controller package PKG3 600 is a component in which embedded controller chips 200 of the type described above with reference to FIG. 12 are packaged independently from the multi-channel package(s) 100, and which is mounted on the main board 500. The memory controller package PKG3 600 of this example is disposed between a multi-channel package 100 and the SSD controller 300.

Furthermore, the chip input capacitance Cin in the SSD device 1000a is minimal. Chip input capacitance Cin refers to capacitance that is present when a controller operates a memory package, and is equal to the sum of the capacitance of the package substrate and capacitances of the chips of the package. Thus, the chip input capacitance Cin is higher the greater the number of chips in the package. However, in the SSD device 1000a according to the inventive concept, the SSD controller 300 access just up to the memory controller package 600, and thus the chip input capacitance Cin is established by the memory controller package 600. Accordingly, even though the memory package(s) may each have a fairly large number of semiconductor chips (at least four), the chip input capacitance Cin may be minimized to some extent. The minimized wiring lengths and the low chip input capacitance Cin allow the SSD device 1000a to operate at a relatively high speed and to offer high performance.

Figure 20:
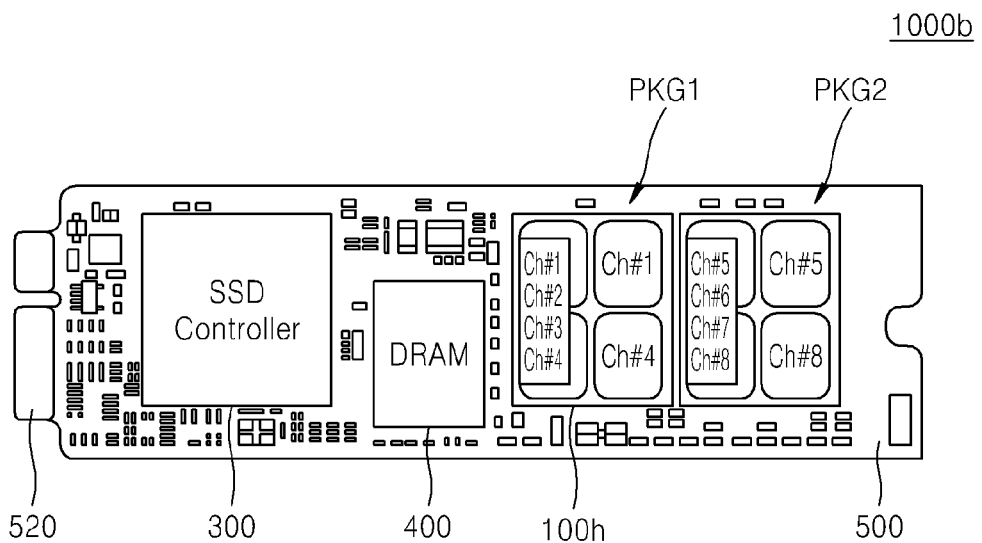
FIG. 20 is a plan view of still another example of an SSD according to the inventive concept.

Still another example of an SSD 1000b according to the inventive concept will be described with reference to FIG. 20.

The SSD 1000b is similar to the SSD 1000 of FIG. 16 but differs from the SSD 1000 with regard to the structure of each multi-channel package. Specifically, the SSD 1000b includes a multi-channel package(s) 100h of the type described with reference to FIG. 12 in which the embedded controller chip 200 is packaged (e.g., encapsulated) along with the memories.

Another example of an SSD 1000c according to the inventive concept will be described with reference to FIG. 21.

The SSD 1000c has a multi-channel package 100g including eight channels as distinguished from the other examples of the SSDs according to the inventive concept. The multi-channel package 100g may be of the type described with reference to FIG. 11. However, the structure of the multi-channel package 100g is not limited to having the configuration of the multi-channel package 100f of FIG. 11. Furthermore, more than one multi-channel package 100g may be provided. For example, if the SSD controller 300 includes sixteen channels, the SSD device 1000c may include two multi-channel packages 100g.

The lengths of the wiring are minimal in this example, however, because the SSD 100c includes only one multi-channel package 100g compared to a corresponding SSD in which four memory packages are provided in alignment Accordingly, the SSD 1000c can operate at a relatively high speed.

Still another example of an SSD 1000d according to the inventive concept will be described with reference to FIG. 22.

Figure 21:
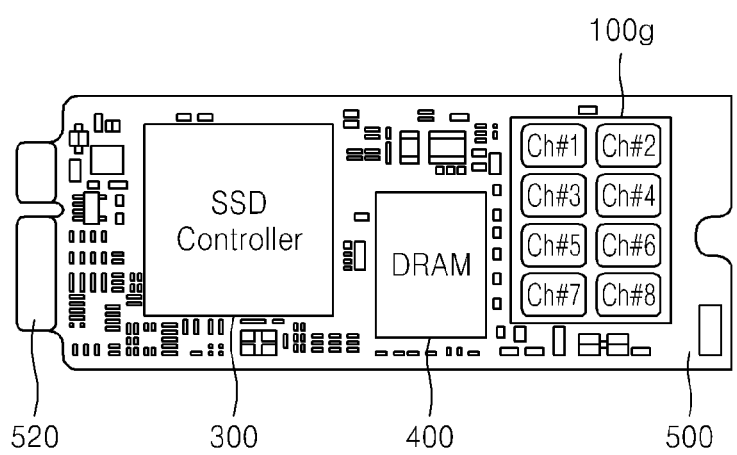
FIG. 21 is a plan view of another example of an device according to the inventive concept.

The SSD 1000d includes a multi-channel package 100g having eight channels, like the SSD 1000c of FIG. 21, and a memory controller package 600 as like the SSD 1000a of FIG. 18. Thus, this SSD 1000d has the advantages described with reference to FIGS. 18, 19 and 21.

Figure 22:
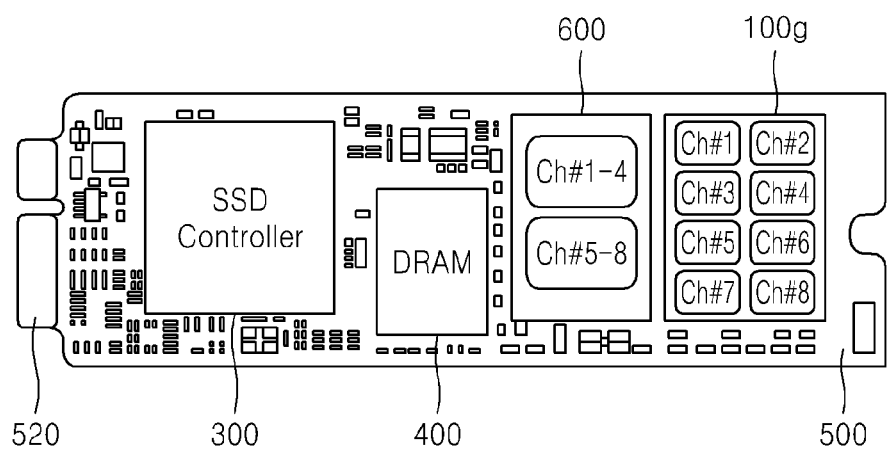
FIG. 22 is a plan view of still another example of an SSD device according to the inventive concept.

In the examples of SSDs of FIGS. 18 and 22 described above, the memory controller package 600 is shown and described as having only two chips such that each chip takes charge of (controls the transmission of signals/data through) four channels. However, these SSDs according to the inventive concept may instead have a memory controller package of a type illustrated in FIGS. 23A through 23D.

Figure 23A:
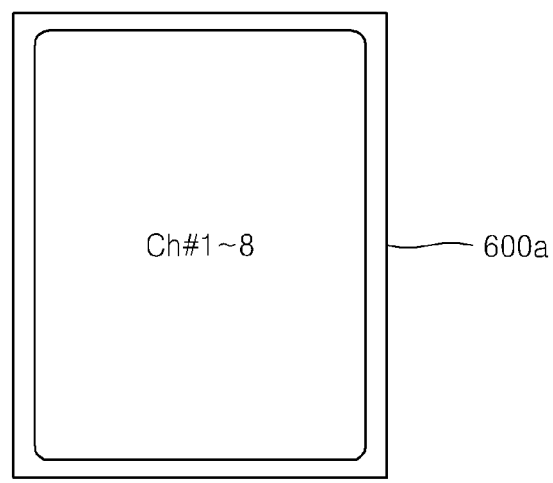
FIGS. 23A through 23D are each a schematic diagram of a memory controller package that may be employed by an SSD according to the inventive concept.
Figure 23B:
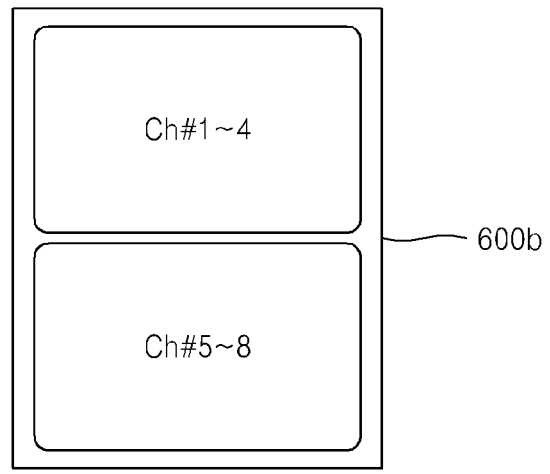
Figure 23C:
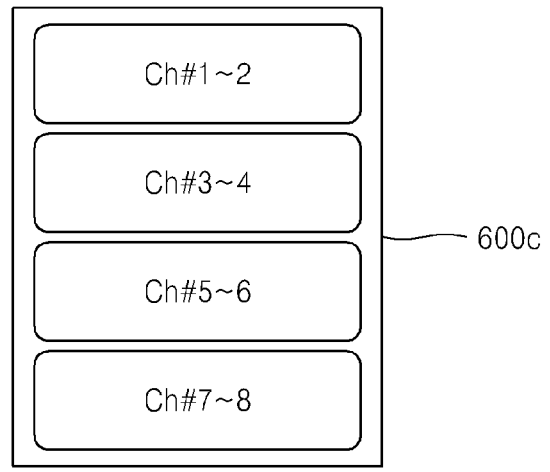
Figure 23D:
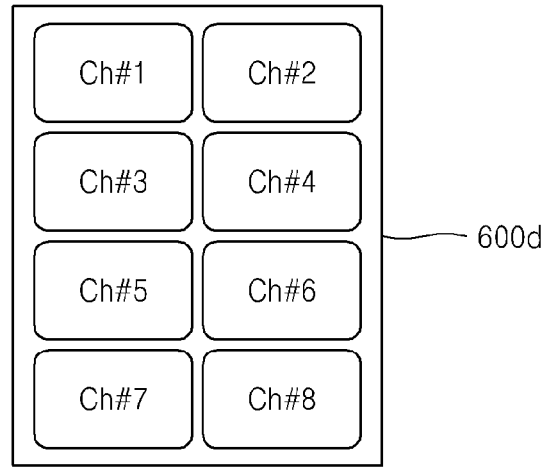

Referring to FIG. 23A, for example, the memory controller package 600a may include one semiconductor chip that takes charge of eight channels. Alternatively, as illustrated in FIG. 23B, the memory controller package 600b may have two semiconductor chips each of which takes charge of four respective channels. Furthermore, as illustrated in FIG. 23C, the memory controller package 600c may include four semiconductor chips each of which takes charge of two respective channels. As illustrated in FIG. 23D, the memory controller package 600c may include eight semiconductor chips each of which takes charge of one respective channel.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A multi-channel package having at least four channels, and comprising:

a package substrate having a first surface and a second surface, and groups of bonding pads on the first surface, each of the groups of bonding pads constituting a respective one of the channels such that the number of groups of the bonding pads is the same as the number of channels;

4n semiconductor chips mounted to the package substrate as stacked one on the other on the first surface thereof, wherein n is a positive integer equal to or greater than 1 such that there are at least four of the semiconductor chips or at least four groups of at least two of the semiconductor chips; and a plurality of groups of external connection terminals on the second surface of the package substrate, each of the groups of the external connection terminals constituting a respective one of the channels such that the number of groups of the external connection terminals is also the same as the number of channels, and wherein each of the groups of bonding pads is directly electrically connected to a respective one only of the semiconductor chips or to a respective one of the groups only of the semiconductor chips, such that the groups of the bonding pads are directly electrically connected in the package to one semiconductor chip or one group of semiconductor chips, respectively, each of the groups of bonding pads is electrically connected to a respective one only of the groups of external connection terminals, respectively, such that the groups of the bonding pads are electrically connected in the package to the groups of external connection terminals, respectively, each of the channels constitutes a discrete conductive path in the package associated with and along which signals are transmitted to/from a respective one or group of the semiconductor chips in the package, and the conductive path constituted by each of the channels is discrete and independent from those of the other channels in the package such that each of the chips can only transmit/receive signals to/from the external connection terminals via one of the channels amongst the at least four channels.

2. The multi-channel package of claim 1, wherein at least one of the semiconductor chips associated with each of the channels has a plurality of chip pads directly electrically connected to a respective one of the groups of bonding pads.

3. The multi-channel package of claim 2, having four channels, and
wherein n=2 such that the package has eight semiconductor chips, each of the second through eighth semiconductor chips from the package substrate is offset in a horizontal direction relative to the chip on which it is disposed directly on, the bonding pads are disposed along two sides of the first surface of the package substrate with two respective ones of the groups of the bonding pads being provided on each of the two sides of the first surface, and the two groups of bonding pads on each of the two sides of the first surface of the package substrate constituting two of the channels, respectively.

4. The multi-channel package of claim 3, wherein each of the second through fifth semiconductor chips from the package substrate are offset in a first horizontal direction relative to the semiconductor chip on which it is disposed directly on, and the sixth through eighth semiconductor chips from the package substrate are each offset in a second horizontal direction opposite the first horizontal direction relative to the semiconductor chip on which it is directly disposed, such that the stack of chips has a cascading form.

5. The multi-channel package of claim 3, wherein the third, fifth, and seventh semiconductor chips from the package substrate are offset in a first horizontal direction relative to the semiconductor chip on which it is disposed directly on, and the second, fourth, sixth, and eighth semiconductor chips from the package substrate are each offset in a second horizontal direction opposite the first horizontal direction relative to the semiconductor chip on which it is directly disposed, such that the stack of chips has a zigzagging form.

6. The multi-channel package of claim 1, having four channels, and
wherein n=2 such that the package has eight semiconductor chips, the semiconductor chips are disposed one atop the other in a vertical direction so as to form a stack of chips with each of the chips being offset relative to the semiconductor chip on which it is disposed directly on, and
four of the groups of the bonding pads are disposed along four sides of the first surface of the package substrate, respectively.

7. The multi-channel package of claim 6, wherein the second, third and fifth semiconductor chips from the package substrate are each offset in a first horizontal direction relative to the semiconductor chip on which it is directly disposed,
the sixth through eighth semiconductor chips are each offset in a second horizontal direction, opposite the first horizontal direction, relative to the semiconductor chip on which it is directly disposed,
the fourth semiconductor chip from the package substrate is offset in a third horizontal direction, perpendicular to the first and second directions, relative to the third semiconductor chip from the package substrate, and
the eighth semiconductor chip from the package substrate is offset in a fourth horizontal direction, opposite the third horizontal direction, relative to the seventh semiconductor chip from the package substrate.

8. The multi-channel package of claim 1, having eight channels and wherein n≥2.

9. The multi-channel package of claim 1, wherein the semiconductor chips are memory chips, and further comprising an embedded control chip mounted on the package substrate.

10. An electronic device comprising:
a main board including wiring;
at least one multi-channel package mounted to the main board, the multi-channel package comprising at least four semiconductor chips, external connection terminals by which the package is electrically connected to the main board, and at least four channels,
wherein each of the channels constitutes a discrete conductive path in the package associated with and along which signals are transmitted to/from a respective one or group of the semiconductor chips in the package, and the conductive path constituted by each of the channels is discrete and independent from those of the other channels in the package such that each of the chips can only transmit/receive signals to/from the external connection terminals via one of the channels amongst the at least four channels; and
a controller package mounted on the main board, the controller package having 4n channels wherein n is an integer equal to or greater than 2, each of the channels of the controller package being connected by the wiring of the main board to a respective one of the channels only among all of the channels of the at least one multi-channel package.

11. The electronic device of claim 10, wherein the multi-channel package comprises a package substrate having a first surface and a second surface,
the semiconductor chips are mounted to the package substrate on the first surface thereof, and
the external connection terminals are disposed on the second surface of the package substrate.

12. The electronic device of claim 10, wherein the electronic device is a solid state drive (SSD), and
the controller package is an SSD controller package, and
the SSD controller package has eight channels.

13. The electronic device of claim 12, comprising two of the multi-channel packages, and wherein each of the multi-channel packages has four channels.

14. The electronic device of claim 12, wherein one of the multi-channel package has eight channels.

15. The electronic device of claim 10, wherein at least one of the multi-channel packages further comprises an embedded control chip.

16. The electronic device of claim 12, wherein the electronic system further comprises a memory controller package mounted to the main board, and the memory controller package electrically connects the SSD controller package to the multi-channel packages.

17. An electronic device comprising:
a main board including a wiring pattern of discrete wires;
a plurality of multi-channel packages mounted to the main board, each multi-channel package being in accordance with claim 1.

18. The electronic device of claim 17, wherein the electronic device is a solid state drive (SSD).

19. The electronic device of claim 18, further comprising a DRAM mounted to the main board.

* * * * *